United States Patent [19]

Okuyama et al.

[11] Patent Number: 4,774,631
[45] Date of Patent: Sep. 27, 1988

[54] COOLING STRUCTURE OF ELECTRONIC EQUIPMENT RACK

[75] Inventors: Katsuo Okuyama, Kawasaki; Susumu Arai, Machida; Masao Ishiwata, Yokohama; Hirotoshi Takada, Kawasaki, all of Japan

[73] Assignee: Fujitsu Limited, Kawasaki, Japan

[21] Appl. No.: 885,839

[22] PCT Filed: Nov. 15, 1985

[86] PCT No.: PCT/JP85/00640

§ 371 Date: Jul. 15, 1986

§ 102(e) Date: Jul. 15, 1986

[87] PCT Pub. No.: WO86/03089

PCT Pub. Date: May 22, 1986

[30] Foreign Application Priority Data

Nov. 15, 1984 [JP] Japan ............................... 59-241217
Feb. 7, 1985 [JP] Japan ............................... 60-020931
Feb. 20, 1985 [JP] Japan ............................... 60-030179

[51] Int. Cl.⁴ ............................................. H02B 1/00
[52] U.S. Cl. ................................. 361/384; 361/381; 361/379
[58] Field of Search ................. 361/381, 383, 384, 385

[56] References Cited

U.S. PATENT DOCUMENTS 4,158,875 6/1979 Tajima et al. .......................... 361/385

FOREIGN PATENT DOCUMENTS 55-27279 6/1980 Japan ............................... 361/384
56-2439 1/1981 Japan ............................... 361/384
57-6296 1/1982 Japan ............................... 361/384
58-99821 6/1983 Japan ............................... 361/381
60-132395 7/1985 Japan ............................... 361/384

OTHER PUBLICATIONS

IBM Technical Disclosure Bulletin, Air Cooling Scheme, Antonetti et al., vol. 14, No. 2, Jul. 1971.
IBM Technical Disclosure Bulletin, Staggered Logic-/Memory Board Configuration for Improved Card Cooling, Follette et al., vol. 20, No. 7, Dec. 1977.

Primary Examiner—Robert S. Macon
Attorney, Agent, or Firm—Staas & Halsey

[57] ABSTRACT

A cooling structure for an electronic equipment rack which comprises a plurality of shelf units stacked one upon another and arranged in a cabinet, each shelf unit accommodating a plurality of printed circuit boards and having vent holes formed on upper and lower surfaces thereof respectively. A fan unit having at least one fan is disposed on top of each shelf unit to constitute a separate cooling block. The fan unit of each cooling block generates a cooling wind which is passed linearly through the shelf unit from the bottom to the top of the shelf unit as well as introducing atmosphere through vent holes formed on side face portions of each fan unit to mix the atmosphere with the cooling wind. As a result, the flow rate of the cooling wind will be gradually increased as the cooling wind proceeds to the upper cooling blocks due to the addition of an upward blowing force caused by the fans of the fan units.

6 Claims, 10 Drawing Sheets

Fig. 1
Fig. 2
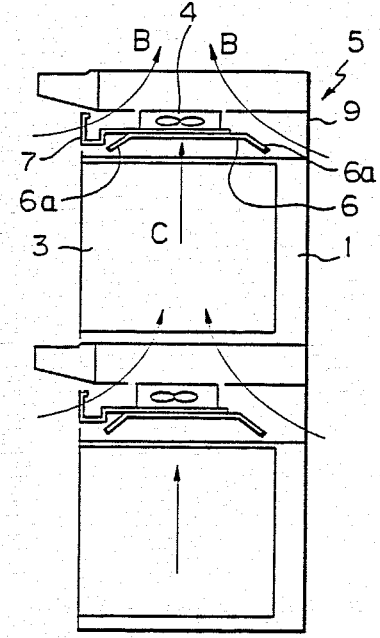
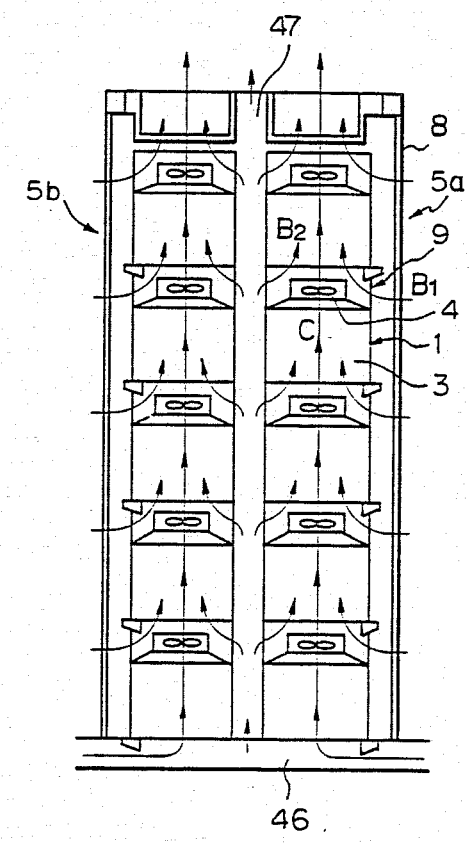

COOLING STRUCTURE OF ELECTRONIC EQUIPMENT RACK

BACKGROUND OF THE INVENTION

1. Field of the Invention

The present invention relates to a cooling structure of an electronic equipment rack which comprises a plurality of shelf units stacked one upon another, each shelf unit including a plurality of printed circuit boards, for electronic equipment such as a communication equipment and an exchange, and particularly to a forced air cooling type cooling structure provided with fans.

2. Description of the Related Art

In electronic equipment such as communication equipment, a plurality of printed circuit boards are housed in a shelf unit having a predetermined function, and a plurality of the shelf units are stacked one upon another and arranged in a cabinet or fitted to a frame to constitute a rack having a particular function. The shelf units must be cooled for long term stabilization of the function of respective printed circuit boards housed in each shelf unit. Recently, the thermal density of a printed circuit board and of a shelf unit accommodating plural printed circuit boards have increased with the advance of a high density arrangement of elements on the printed circuit board and high-level integration of the individual elements. For example, the thermal density of a conventional printed circuit board is 10 watts per liter, as indicated by a black dot shown in FIG. 17. On the other hand, the technical development in recent years has brought the power consumption to ½ and the volume to ¼ of those in the conventional printed circuit board, with the result of increasing the thermal density to 20 watts per liter, which is twice the conventional case, as indicated by a white dot in the figure.

To cool the shelf unit accommodating printed circuit boards exhibiting such a large thermal density, a forced air cooling type cooling structure provided with fans is used. In this type of cooling structure, an important factor for realizing effective heat radiation is not only the temperature of the cooling air which passes over the printed circuit board but also the velocity of the cooling air.

FIGS. 15 and 16 show a prior art cooling structure. In the figures, two shelf units 101 are stacked one upon the other, and a cooling unit 102 is disposed on top of them. The stacked shelf units 101 and cooling unit 102 constitute a cooling block, and a plurality (two in the example shown in FIG. 15) of the cooling blocks are stacked and received in a cabinet (not shown) to constitute a rack 105 as a whole. As shown in FIG. 16, a plurality of printed circuit boards 103 are housed side by side in each shelf unit 101. In the cooling unit 102, four fans (blowers) 104 each blowing frontward are provided. For the two-story, or two-tier, shelf units, the fan 104 takes atmosphere in from the bottom of the two-story shelf units, allows the air to pass through the shelf units, and discharges the air through a front door (not shown) of the cabinet at the front of rack 105, as indicated by an arrow A (FIG. 15).

The prior art cooling structure mentioned in the above has the following drawbacks:

(1) A plurality (two in this example) of the shelf units 101 stacked under the fan 104 are cooled by the cooling air which first cools the lower shelf unit and therefore, is heated by the lower shelf unit, and then cools the upper shelf unit by passing thereover. As a result, the temperature of the cooling air for cooling the upper shelf unit is higher than that for cooling the lower shelf unit, causing a temperature difference between the upper and lower shelf units. Accordingly, the cooling capacity for the upper shelf unit is lowered. Since an allowable total heating value in each cooling block is set according to the temperature of the shelf unit which will have a higher temperature (normally, the lower shelf unit), the heating value of the upper shelf unit will be restricted by the temperature difference mentioned above.

(2) If cooling units with fans are provided for respective shelf units to solve the problem mentioned above in (1), the cooling units will occupy a large space in the cabinet and prevent an overall high density arrangement in the cabinet.

(3) A flow of the cooling wind (arrow A) is suddenly changed from a bottom-to-top direction to a lateral (horizontal) direction by the rear, slope surface 102a of the cooling unit 102, and thus the flow resistance become large and the cooling efficiency is deteriorated.

(4) If a fan in the cooling unit 102 fails, the temperature of the shelf unit located under the cooling unit accommodating the failed fan tends to be increased, and reliability can not be attained.

(5) Since the cooling wind is discharged laterally (horizontally) through the front door of cabinet, the discharged air will give an uncomfortable feeling to maintenance personnel and a loud noise from the fans.

SUMMARY OF THE INVENTION

In view of the problems of the prior art cooling structure mentioned above, it is an object of the present invention to provide a cooling structure for an electronic equipment rack, which can effectively cool respective shelf units of the rack and secure a specified wind velocity necessary for the radiation of heat without increasing the height of the rack.

In order to accomplish this object, the present invention provides a cooling structure for an electronic equipment rack which comprises a plurality of shelf units stacked one upon another and arranged in a cabinet, each shelf unit accommodating a plurality of printed circuit boards and having vent holes formed on upper and lower surfaces thereof respectively, wherein a fan unit having at least a fan is disposed on top of each shelf unit to constitute a separate cooling block, and the fan unit of each cooling block generates a cooling wind which is passed linearly through the shelf unit from the bottom to the top of the shelf unit as well as introducing fresh ambient air through vent holes formed on side face portions of each fan unit to mix the atmosphere with the cooling wind so that the flow rate of the cooling wind will be gradually increased as the cooling wind proceeds to the upper cooling blocks due to the additional upward blowing force caused by the fans of the fan units.

BRIEF DESCRIPTION OF THE DRAWINGS

These and other objects and features of the present invention will become apparent from the following description with reference to the accompanying drawings, in which:

FIG. 1 is a side elevational view of the basic configuration of a cooling structure according to the present invention;

FIG. 2 is a side elevational view of the configuration of an electronic equipment rack provided with the cooling structure according to the present invention;

DESCRIPTION OF THE PREFERRED EMBODIMENTS

Figure 3:
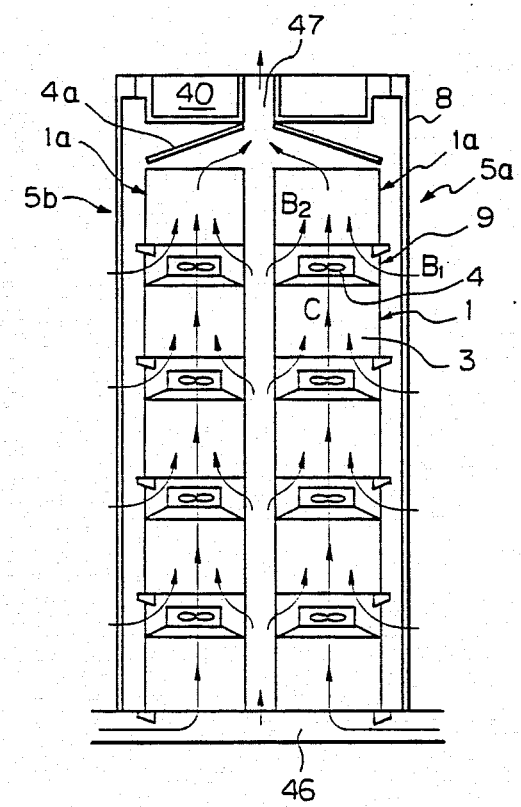
FIG. 3 is a side elevational view of the configuration of another embodiment of an electronic equipment rack provided with the cooling structure according to the present invention.

FIG. 1 side elevational view illustrating the basic configuration of an electronic equipment rack in accordance with the present invention. A fan unit 9 is disposed on top of each shelf unit 1 which houses a plurality (only one is shown) of printed circuit boards 3. The fan unit 9 is provided with vent holes (not shown) formed on upper and lower surfaces of the fan unit 9 to allow a cooling wind to pass. A plurality (only one is shown) of fans 4 are arranged horizontally in the fan unit 9, each fan 4 blowing upward. Each fan 4 is fixed to a support frame 7 which is fixed to a support plate 6 which constitutes a frame of each fan unit 9. Slanted guide portions 6a are provided for front and rear end portions of the support plate 6 to take atmosphere in along arrow marks B from the front (the left side of FIG. 1) and the back (the right side of FIG. 1) of the fan unit 9. The fans 4 of each fan unit 9 suck air from a shelf unit 1 located just below the fan unit 9 and send it to a shelf unit 1 located just above the fan unit 9, as indicated by an arrow mark C, as well as taking fresh ambient air along the arrow marks B into the fan unit 9 which forces same, at an increased pressure, to the shelf unit 1 (not shown in FIG. 1) located just above the fan unit 9. As mentioned in the above, fan units 9 are assembled with respective shelf units 1 and together comprise corresponding cooling blocks. A plurality of the cooling blocks are stacked and received in a cabinet (not shown) to constitute a rack.

FIG. 2 is a schematic and front elevation view illustrating the basic configuration of an electronic equipment rack provided with the cooling structure according to an embodiment of the present invention. Two racks 5a and 5b are set on an air passage 46 arranged on the floor such that the backs of racks 5a and 5b face each other. An air passage 47 communicating with the air passage 46 arranged on the floor is formed between the racks 5a and 5b. Front doors 8 having proper vent openings (not shown) for introducing fresh air are provided at the fronts of racks 5a and 5b. Each of the racks 5a and 5b comprises a plurality of tiers (five tiers in this embodiment) of shelf units 1. On top of each shelf unit 1, there is provided the fan unit 9 having at least one (only one is shown in the figure) fan 4 which is arranged horizontally. Each fan unit 9 sucks air from its lower shelf unit 1 to send the air upward as indicated by an arrow mark C as well as taking in fresh ambient air from the front and rear faces of the fan unit 1 to send the air to its upper shelf unit at an increased pressure as indicated by arrow marks $B_1$ and $B_2$. Namely, cooling air is introduced from the air passage 46 arranged on the floor into the lowest shelf unit, passed successively and linearly through the successive, upper shelf units 1 as indicated by the arrow mark C, and discharged from the top surface of the uppermost shelf unit 1. At the same time, fresh ambient air is introduced at each of the shelf units as indicated by the arrow marks $B_1$ and $B_2$. As the cooling air indicated by the arrow mark C proceeds to the successively upper shelf units 1, the cooling air is heated by the shelf units and the temperature of the cooling air will be continuously increased. The cooling air, however, is cooled by the fresh ambient air which is introduced at each of the shelf units as indicated by the arrow marks $B_1$ and $B_2$ so that the temperature increase of the cooling air in the upper shelf units 1 will be suppressed, i.e., limited to a relatively small amount. Further, the rate and velocity of airflow is increased successively toward the upper shelf units, because the fresh ambient air is introduced at each of the shelf units. As a result, the dissipation of heat from the upper shelf units is increased so that the cooling effect necessary for maintaining a stable shelf function is achieved even if the temperature of cooling air is increased by a certain degree. The cooling air is discharged upwardly but not frontwardly after passing through the shelf units so that maintenance personnel standing in front of the rack will not be given an unpleasant feeling, and noise due to the rotation of fans will be suppressed to a low level. Since the fans are arranged horizontally with their blowing directions upward, the installation space in a facility in which the racks are mounted will be used efficiently and with a high density. Since each shelf unit is provided on top with a fan unit, each shelf unit may have two fan units, one on each of the upper and lower surfaces thereof respectively. Therefore, even if one fan fails and stops, a forced convection action of the cooling air will be effected with almost no hindrance so that the reliability of the cooling action will be increased. Further, a ventilation action is smoothly carried out even if the thicknesses of printed circuit boards and the pitches of printed circuit board array are different in respective upper and lower shelf units so that the degree of freedom in mounting the printed boards will be increased. For a shelf unit in which the heating value is relatively smaller, the fan unit otherwise located just above the shelf unit may be omitted.

FIG. 3 is a vertical elevational view of a rack which is provided with the cooling structure according to the another embodiment of the present invention. In this embodiment, fan units are not provided for the uppermost shelf units 1a of the racks 5a and 5b. Instead, guide plates 4a are provided above the uppermost shelf units 1a to guide the heated discharge air toward the center air passage 47 to prevent the heated air from being discharged from the upper surfaces of the uppermost shelf units 1a. This arrangement is required to protect cables against the heat of discharged air when the cables are arranged in the uppermost spaces 40 of the racks 5a and 5b. The other components of the structure and the action, and effect of this embodiment are the same as those of the embodiment shown in FIG. 2.

Figure 4:
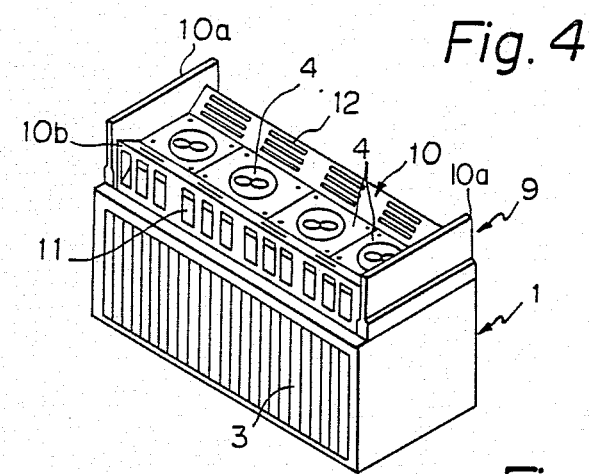
FIG. 4 is a perspective view of the basic configuration of the cooling structure according to the present invention.
Figure 5:
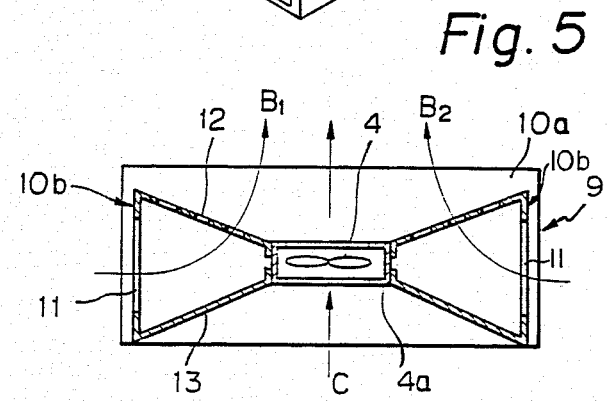
FIG. 5 is a cross-sectional view in a vertical plane of a fan unit portion of the structure shown in FIG. 4.

FIG. 4 is a perspective view illustrating the configuration of a fan unit 9 in accordance with an embodiment of the invention. A shelf unit 1 houses a plurality of printed circuit boards 3 which are arranged vertically in the shelf unit 1. The fan unit 9 disposed on the shelf unit 1 comprises a unit frame 10 comprising first and second side frames 10a and cross front and rear frames 10b, and four fans 4 which are arranged horizontally. Each cross frame 10b has a cross-section of substantially a triangular shape as shown in FIG. 5, and is provided with a plurality of intake ports 11 formed on its vertical surface for taking atmosphere in, vent holes 12 formed on an upper surface, and slanted guide portions 13 defining on a lower surface for guiding atmosphere upward (indicated by arrow marks $B_1$ and $B_2$) and for guiding air from a lower side to the fans 4 (an arrow mark C). Each fan 4 is fixed to the cross frames 10b through a frame 4a by proper means such as screws.

Figure 6:
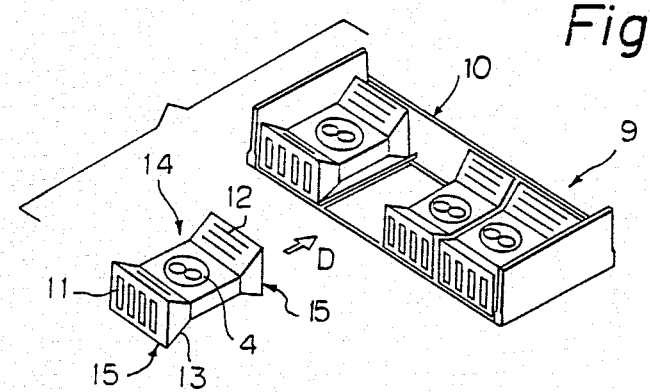
FIGS. 6 and 7 are perspective and exploded view of cassette-type embodiments of the fan unit according to the present invention.

FIG. 6 is a perspective view of another embodiment of the fan unit 9. In this embodiment, front and rear support frames 15 each comprising intake ports 11', vent holes 12', and slanted guide portions 13', and a fan 4 are integrally formed in advance to constitute a separate cassette type fan 14. The cassette type fan 14 is mounted on a unit frame 10 from the front thereof as indicated by an arrow mark D. By adopting such a cassette type structure, the installation and removal of the fan until 14 can be easily carried out, maintenance and replacement work.

Figure 7:
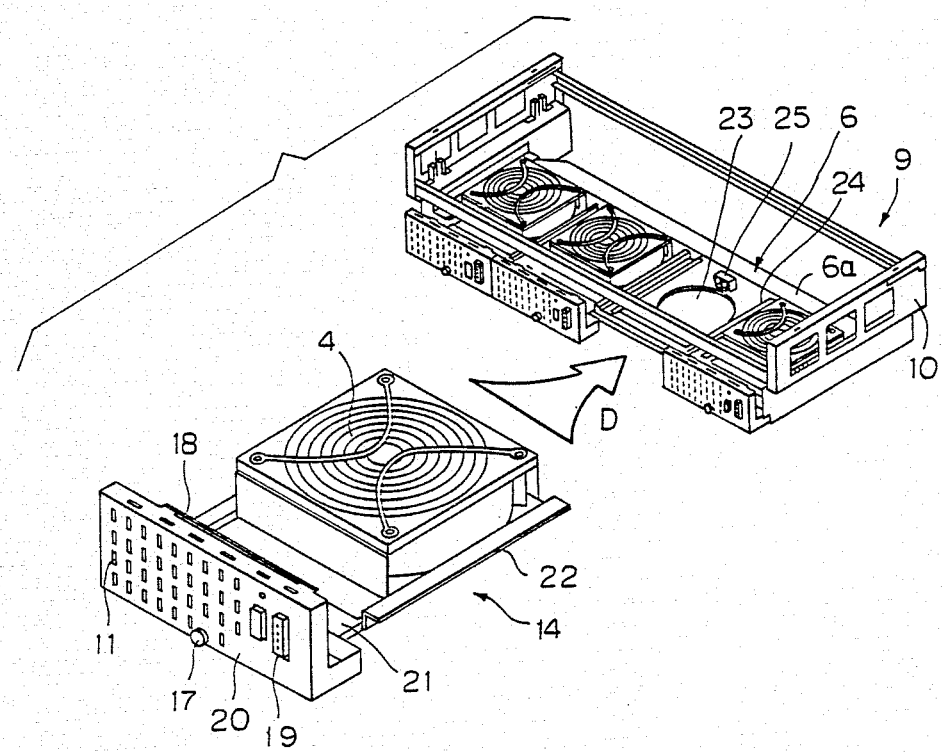

FIG. 7 shows another embodiment in accordance with the invention of a cassette type fan. In this embodiment, a support plate 6 having slanted guide portions 6a, which have cross-sections corresponding to those shown in FIG. 1, is fixed to a unit frame 10. Along guide rails 24 of the support plate 6, side pieces 22 of a cassette type fan 14 are slid to insert the cassette into a unit 9 from the front thereof as indicated by an arrow mark D. The support plate 6 is provided with a hole 23 at a position corresponding to the fan 4. The numeral 25 represents a means for fixing, i.e., latching the cassette. The cassette fixing means 25 may be a mechanical means in which a projection formed on the cassette is held and fixed between two rollers which are engaged with each other by spring means, or may be a magnetic means. The cassette type fan 14 comprises a front panel 20 having atmosphere intake ports 11, a pulling thumbscrew 17, a connector 19 for supplying electric power, a printed circuit board 18, etc., and the fan 4, which are fixed together to a support frame 21.

Figure 8:
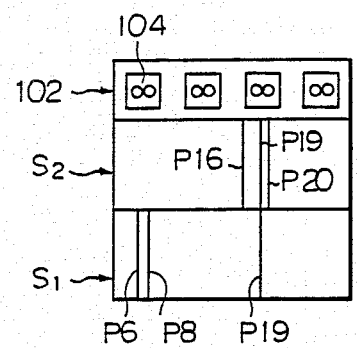
FIGS. 8 and 9 are schematic illustration of structures according to the prior art and to the present invention, respectively, used for explaining a temperature rise experiment.
Figure 9:
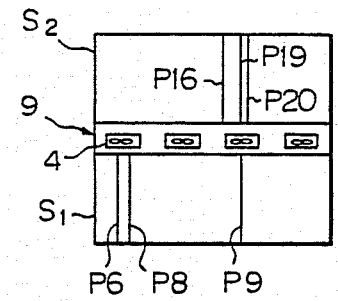
Figure 10:
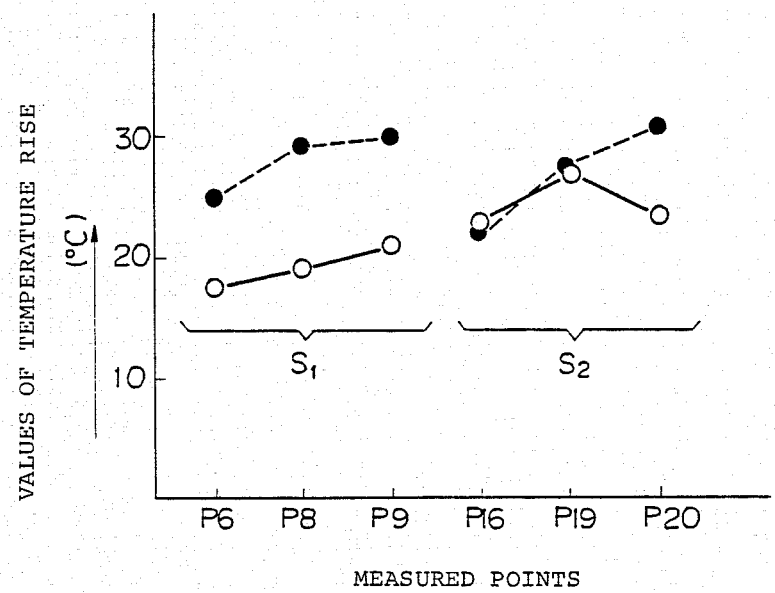
FIG. 10 is a graph showing a result of the experiment related to FIGS. 8 and 9.

FIGS. 8 to 10 explain an experiment carried out to check a temperature rise of the structures according to the present invention.

In FIGS. 8 and 9, the labels $S_1$ and $S_2$ identify shelf units positioned in a first tier and a second tier, respectively, and the labels P6, P8, P16, P19, and P20 identify printed circuit boards and their sequence. For instance, the label P6 indicates a printed circuit board arranged in a sixth column from the left facing the shelf unit; P8, a printed circuit board in an eighth column; and so on. In FIG. 8 the numeral 102 identifies a prior art fan and 104, a fan of the prior art fan unit 102; in FIG. 9, the numeral 9 identifies a fan unit of the present invention and 4 a fan of the fan unit 9 of the present invention. The experiment was carried out subject to the same values of total power consumption (power supply), of individual power consumption and heating distribution of each printed circuit board, and of the blowing rate of the fan unit, for the prior art example (FIG. 8) as for those of the present embodiment (FIG. 9). Under these conditions, ambient temperatures on respective printed circuit boards were measured to obtain experimental values shown in FIG. 10.

In FIG. 10, temperature rises (°C.) are plotted on the ordinate axis, and measuring points on the abscissa. Black dots represent measured values for the prior art, and white dots, the measured values for the present invention. As apparent from the figure, values of the temperature rise in the first shelf unit $S_1$ of the prior art are extremely large in comparison with those of the present invention. Due to this, the power consumption (power supply) of the prior art is restricted. On the contrary, values of the temperature rise of the present invention are small so that the power consumption (power supply) can be increased in the present invention; namely, the allowable heating value for the present invention can be increased. In the second shelf unit $S_2$, values of the temperature rise of the present invention are smaller on the whole than those of the prior art. According to this embodiment of the present invention, however, another fan unit actually be disposed on top of the shelf unit $S_2$; therefore, the coupling effect of the structure according to the present invention will be further increased in practice.

Figure 11:
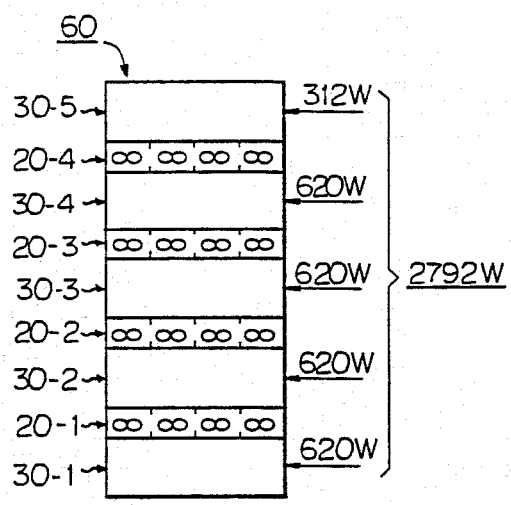
FIG. 11 is a schematic illustration of a structure according to the present invention used for explaining another experiment.
Figure 12:
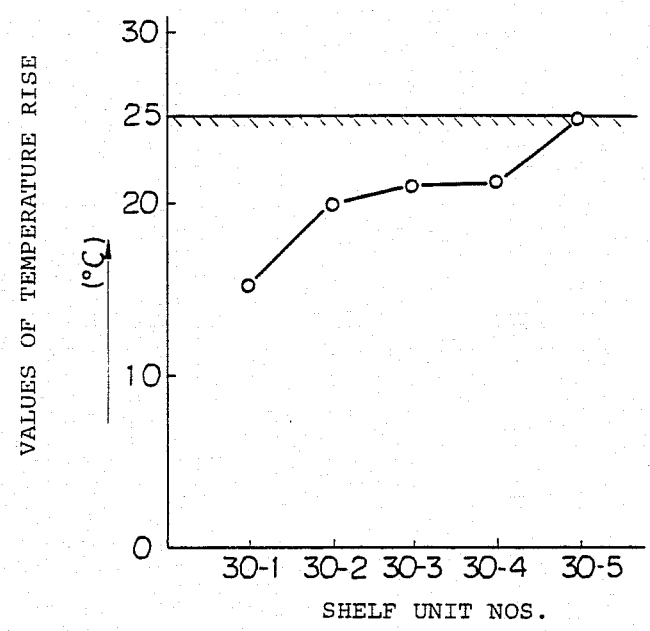
FIG. 12 is a graph showing a result of the experiment relates to FIG. 11.

FIGS. 11 and 12 explain measured values of the temperature rise in an equipment rack 60 according to the present invention. FIG. 11 is a front elevational schematic view of the equipment rack 60 adjacent which values (W) of the power consumption of respective shelf units (30-1 to 30-5) are shown. FIG. 12 is a graph which shows measured values of the temperature rise in respective shelf units (30-1 to 30-5) shown in FIG. 11.

In FIG. 11, the power consumption is 620 W (45 W max. per printed circuit board) for example of the shelf units 30-1 to 30-4, 312 W (13 W max, per printed circuit board) for the shelf unit 30-5, and 2792 W in total. With respect to the power consumption, the maximum temperatures have been measured for respective shelf units 30-1 to 30-5, and the values shown in FIG. 12 have been obtained.

In FIG. 12, values (°C.) of the temperature rise are designated by their spacing along the coordinate, and the shelf unit numbers (30-1 to 30-5) are measured along the abscissa for plotting the data with respect to the coordinates. In the figure, a value 25° C. (the hatched portion in the figure) of the temperature rise indicates an allowable value (a design criterion) to assure the reliability of heating elements. As shown in the figure, the temperature increases gradually from the lowest shelf unit toward the upper shelf units in the shelf units 30-1 to 30-5, and, in the uppermost shelf unit 30-5, the temperature rise is suppressed to 25° C. so that a temperature difference between a certain shelf unit and a shelf unit just below the certain shelf unit will be small. By using the cooling structure having such values of the temperature rise, the total electric power of 2792 W can be consumed. This power consumption is about twice that of the prior art cooling structure.

Figure 13:
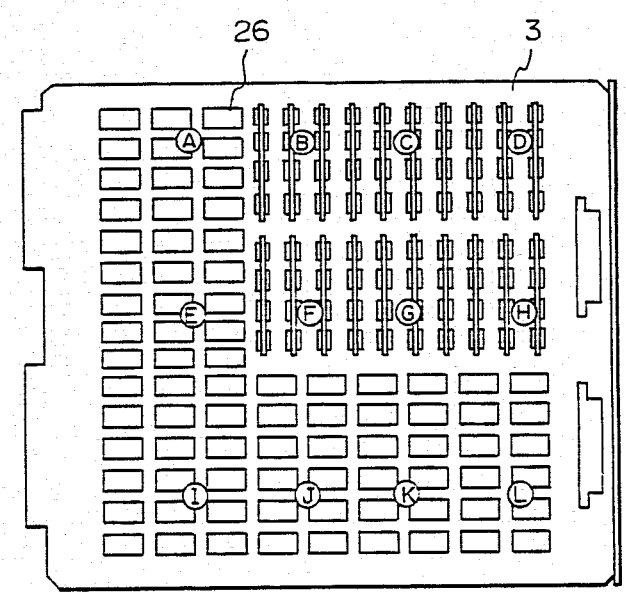
FIG. 13 is a plan view of a printed circuit board, used for explaining still another experiment for the structure according to the present invention.
Figure 14:
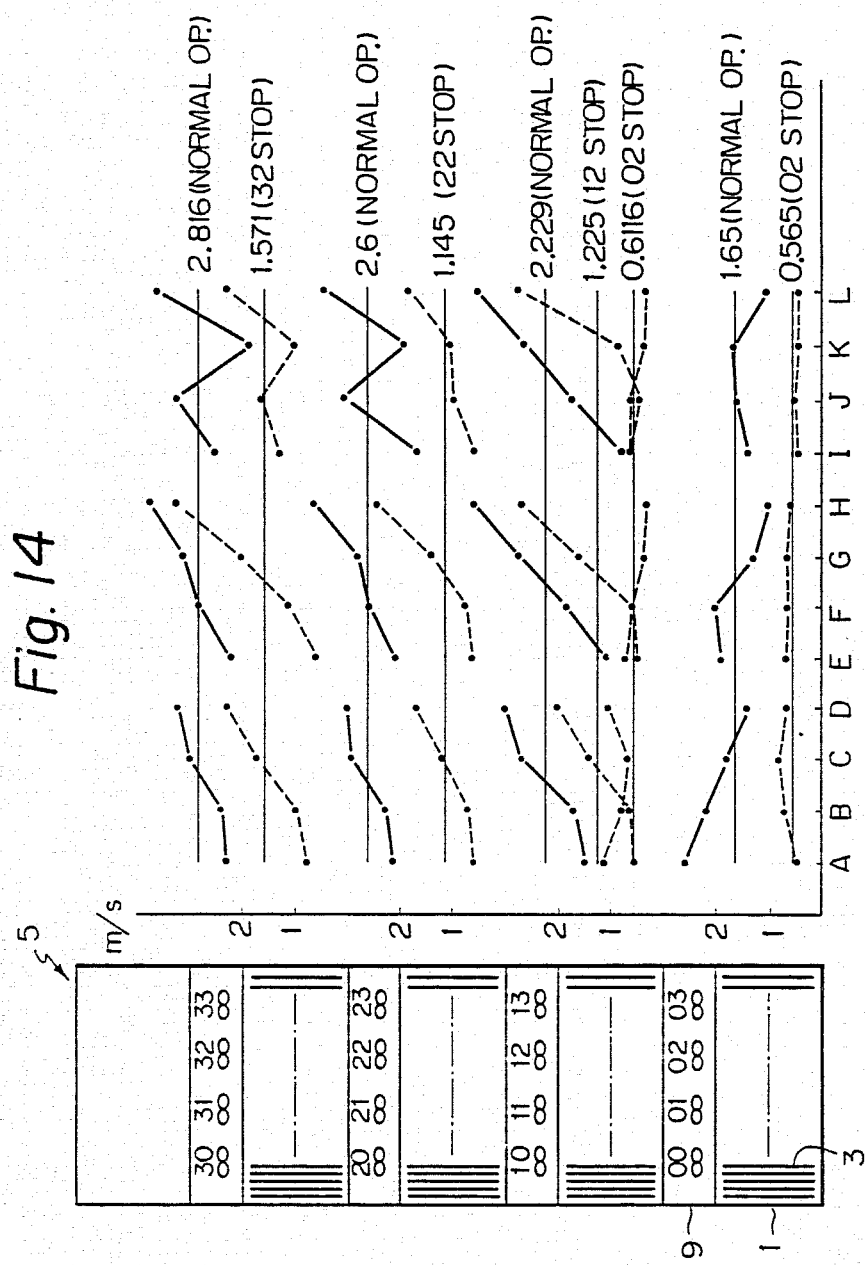
FIG. 14 is a graph showing a result of the experiment relates to FIG. 13.
Figure 15:
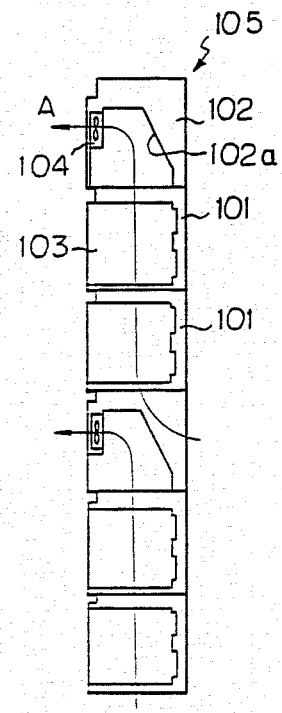
FIG. 15 is a side elevational view of a prior art electronic equipment rack.
Figure 16:
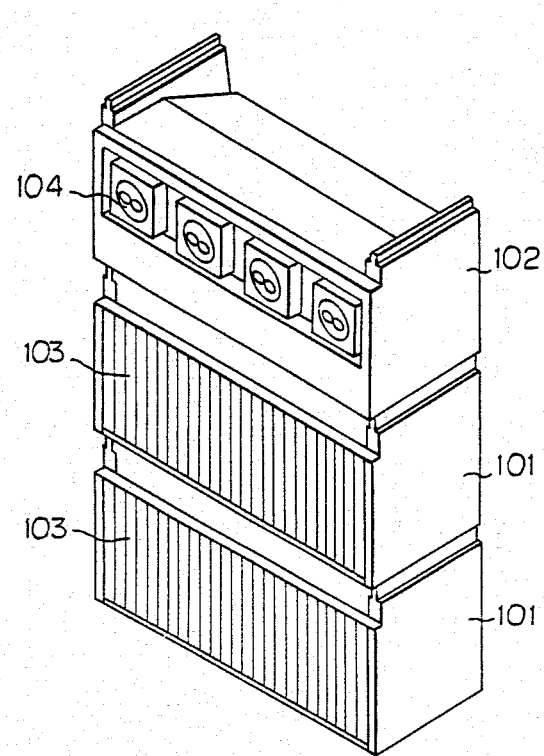
FIG. 16 is a perspective view of a part of the prior art rack of FIG. 15.
Figure 17:
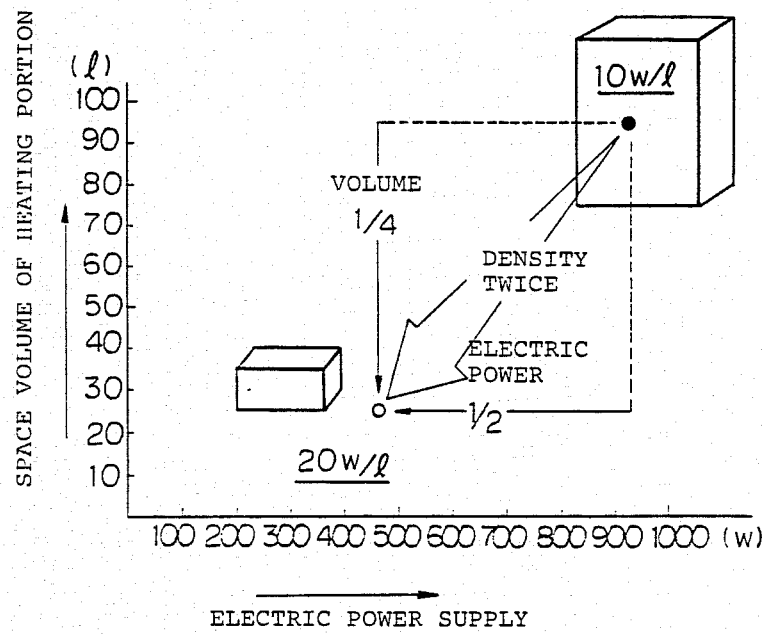
FIG. 17 is a graph illustrating the increase of thermal density of a shelf unit.

A result of an experiment to check wind velocities in the structure according to the present invention will be described with reference to FIGS. 13 and 14. A rack 5 used in the experiment comprises shelf units 1 stacked in four tiers and fan units 9 which are disposed on top of each of the shelf units 1 as shown in the left side of FIG. 14. Each fan unit 9 is provided with four fans (00 to 03 for the first tier, 10 to 13 for the second tier, and so on). Each shelf unit 1 houses 32 printed circuit boards 3. The nineteenth printed circuit board in each tier of the shelf units 1, counted from the left, was measured for wind velocities at positions A to L as indicated in FIG. 13. The numerals 26 represent electronic parts mounted on the printed circuit board. The position of each of the measured printed circuit boards is approximately below the corresponding one of the third fans (02, 12, 22, and 32), as counted from the left in each tier. In FIG. 14, the graph of the plotted measurements corresponds to the four-tier rack shown on the left of the figure. In each shelf unit, results of a normal operation of fans (indicated by continuous polygonal lines) and results of an operation with one of fans being stopped (indicated by dotted polygonal lines) are shown. Numerals shown on the right side of the graph represent averages of measured values. As will be seen from the graph, the higher the tier of a shelf unit, the higher the wind velocity for the shelf unit. Accordingly, the heat radiation is effectively performed to realize a cooling action which is necessary for maintaining the stability of an equipment function, even if the temperature of cooling air is increased.

CAPABILITY OF EXPLOITATION IN INDUSTRY

The present invention is applicable to the electronic equipment industry in which communication equipment, exchange equipment, etc., are assembled in racks which comprise shelf units each accommodating printed circuit boards.

We claim:

1. A cooling structure of an electronic equipment rack comprising a plurality of shelf units in a vertically stacked tier, each shelf unit having generally vertical side wall surfaces and upper and lower, generally horizontal surfaces and accommodating therein a plurality of printed circuit boards with the major planar surfaces thereof oriented in a vertical direction, each of the generally horizontal surfaces having vent holes therein to enable a cooling airflow to pass in a generally vertical direction through the shelf unit, the cooling structure comprising;

plural fan units, each fan unit comprising spaced, generally vertical side wall portions having vent holes therein and at least one fan mounted therein and oriented to produce a flow of air in a generally vertical, upward direction and for introducing ambient air from the exterior of the side wall portions in a generally lateral direction through the vent holes and combining same in additive relationship to the generally upward vertical airflow above the fan;

each fan unit being disposed on the top surface of an associated shelf unit in the electronic equipment rack and defining, with the associated shelf unit, a corresponding cooling block providing a cooling airflow passing in the generally vertical direction through the vent holes of the associated shelf unit and the fan unit; and the successive cooling blocks producing a cooling airflow of gradually increasing flow rate in the upward vertical direction from the lowermost shelf unit to the uppermost shelf unit in accordance with the respective, successive fan units thereof and the additive, ambient airflows respectively introduced by the successive fan units.

2. A cooling structure as recited in claim 1, wherein: the number of said plural shelf units corresponds to the number of said plural shelf units.

3. A cooling structure as recited in claim 1, wherein:
the plurality of shelf units of a given electronic equipment rack include at least a first group of relatively higher heat dissipation character and a second group of relatively lower heat dissipation character; and
said plural fan units correspond to the first group of plural shelf units of higher heat dissipation character, each said fan unit being disposed on the top surface of a respectively associated shelf unit of the first group thereof.

4. A cooling structure as recited in claim 1, wherein there is further provided:
a generally horizontal floor support for the electronic equipment rack, said floor support comprising a lateral airflow passageway therein and at least a first opening therein for supplying air to the lowermost shelf unit of the vertically stacked tier of the equipment rack.

5. A cooling structure as recited in claim 4 for each of first and second electronic equipment racks, wherein:
said floor support supports said first and second electronic equipment racks in parallel, spaced relation so as to define a central, vertical air passageway therebetween and comprises at least first and second openings therein for supplying air to the lowermost shelf units of the vertically stacked tiers of the respective first and second equipment racks and a third opening for supplying air to the central, airflow passageway; and
each of said shelf units and said fan units for the respective first and second electronic equipment racks has parallel, front and back vertical side wall surfaces, the back sidewall surfaces of said respective units of said first and second electronic equipment racks being aligned and disposed in spaced, parallel relationship so as to define the central airflow passageway.

6. A cooling structure as recited in claim 1, wherein each fan unit comprises:
a frame comprising spaced, parallel vertical side walls, support elements extending laterally therebetween, and spaced guide rails extending parallel to the vertical side walls and mounted on said support elements to define a plurality of fan cassette receiving positions; and
plural fan cassettes corresponding to the fan cassette positions, each fan cassette having corresponding side supports receivable in sliding relationship on the respectively associated guide rails, for selective insertion into and removal from said comprising fan cassette positions; and
each fan cassette furthermore having a front panel having plural vent holes therein.

* * * * *

UNITED STATES PATENT AND TRADEMARK OFFICE
CERTIFICATE OF CORRECTION

PATENT NO. : 4,774,631
DATED : September 27, 1988
INVENTOR(S) : Katsuo OKUYAMA et al.

It is certified that error appears in the above-identified patent and that said Letters Patent is hereby corrected as shown below:

Col. 3, line 13, change "view" to --views--;

line 16, change "illustration" to --illustrations--;

line 26, change "relates" to --related--;

line 31, change "relates" to --related--.

Col. 4, line 20, after "pressure" insert --,--.

Col. 6, line 10, after "4" insert --,--;

line 38, after "actually" insert --will--.

line 39, change "coupling" to --cooling--.

Col. 7, line 47 to Col. 8, line 12 (claim 1), delete and replace with:

--1. A cooling structure of an electronic equipment rack comprising a plurality of shelf units in a vertically stacked tier, each shelf unit having first and second, spaced and generally vertical side wall surfaces, spaced and generally vertical front and rear wall surfaces and upper and lower, generally horizontal surfaces and accommodating

UNITED STATES PATENT AND TRADEMARK OFFICE
CERTIFICATE OF CORRECTION

PATENT NO. : 4,774,631
DATED : September 27, 1988
INVENTOR(S) : Katsuo OKUYAMA et al.

It is certified that error appears in the above-identified patent and that said Letters Patent is hereby corrected as shown below:

therein a plurality of printed circuit boards with the major planar surfaces thereof oriented in a vertical direction, each of the generally horizontal surfaces having vent holes therein to enable a cooling airflow to pass in a generally vertical direction through the shelf unit, the cooling structure comprising;

plural fan units, each fan unit being disposed on the top surface of an associated shelf unit disposed beneath the fan unit in the electronic equipment rack and defining, with the associated shelf unit, a corresponding cooling block providing a cooling airflow passing in the generally vertical direction through the vent holes of the associated shelf unit and the fan unit;

each fan unit comprising at least one fan and front and rear frames, respectively defining the front and rear surfaces of each fan unit, connected to the at least one fan for mounting same in a central position within each fan unit,

UNITED STATES PATENT AND TRADEMARK OFFICE
CERTIFICATE OF CORRECTION

PATENT NO. : 4,774,631
DATED : September 27, 1988
INVENTOR(S) : Katsuo OKUYAMA et al.

It is certified that error appears in the above-identified patent and that said Letters Patent is hereby corrected as shown below:

the front and rear frames having respective, generally vertical and spaced apart wall portions corresponding to the front and rear wall surfaces of the shelf units, each vertical wall portion having vent holes therein and each of the front and rear frames further comprising an upper sloped surface having vent holes therein, connected to and extending downwardly from an upper edge of the associated vertical wall portion toward the central portion of the fan unit and a lower sloped surface having no vent holes therein, connected to and extending upwardly from the lower edge of the associated vertical wall portion toward the central portion of the fan unit, each of the front and rear frames thereby having a generally triangular cross-section in a vertical plane transverse to the vertical wall portion thereof, the at least one fan having a frame connected to the sloped surfaces at the central portion of the fan unit for mounting thereof by the front and rear frames, the fan being oriented to

UNITED STATES PATENT AND TRADEMARK OFFICE
CERTIFICATE OF CORRECTION

PATENT NO. : 4,774,631
DATED : September 27, 1988
INVENTOR(S) : Katsuo OKUYAMA et al.

It is certified that error appears in the above-identified patent and that said Letters Patent is hereby corrected as shown below:

produce a flow of air in a generally vertical, upward direction, the lower, sloped surfaces of the front and rear frames guiding the air from the associated shelf unit disposed beneath the fan unit toward the at least one fan thereof, and the vent holes in the vertical wall portions and in the respectively associated upper sloped surfaces, as to each of the front and rear frames, cooperating to introduce ambient air from the exterior and in a generally lateral direction through the vent holes of the vertical wall portions of the front and rear frames and in a generally vertically upward direction through the vent holes in the upper sloped surfaces thereof for combining in an additive relationship with the generally vertical, upward direction flow of air produced by the at least one fan; and the successive, upwardly vertically disposed cooling blocks producing a cooling airflow of gradually increasing flow rate in the upward vertical direction from

UNITED STATES PATENT AND TRADEMARK OFFICE
CERTIFICATE OF CORRECTION

PATENT NO. : 4,774,631
DATED : September 27, 1988
INVENTOR(S) : Katsuo OKUYAMA et al.

It is certified that error appears in the above-identified patent and that said Letters Patent is hereby corrected as shown below:

the lowermost shelf unit to the uppermost shelf unit of the equipment rack in accordance with the respective, successive fan units thereof and the additive, ambient airflows respectively introduced by the successive fan units.--

Col. 8, lines 13-15 (claim 2), delete and replace with:

--2. A cooling structure as recited in claim 1, wherein:

the number of said plural fan units corresponds to the number of said plural shelf units.--

Col. 8, lines 54-69 (claim 6), delete and replace with:

--6. A cooling structure as recited in claim 1, further comprising:

a frame disposed on the top surface of an associated shelf unit and comprising spaced, parallel vertical side walls, support elements extending laterally therebetween, and spaced guide rails extending parallel to

UNITED STATES PATENT AND TRADEMARK OFFICE
CERTIFICATE OF CORRECTION

PATENT NO. : 4,774,631
DATED : September 27, 1988
INVENTOR(S) : Katsuo OKUYAMA et al.

It is certified that error appears in the above-identified patent and that said Letters Patent is hereby corrected as shown below:

the vertical side walls and mounted on said support elements to define a plurality of fan unit receiving positions; and plural fan units receivable in sliding relationship on the respectively associated guide rails, for selective insertion into and removal from said fan unit receiving positions.--

Signed and Sealed this

Sixth Day of June, 1989

Attest:

DONALD J. QUIGG

Attesting Officer

Commissioner of Patents and Trademarks